United States Patent [19]
Grabau et al.

[11] Patent Number: 6,147,662
[45] Date of Patent: Nov. 14, 2000

[54] RADIO FREQUENCY IDENTIFICATION TAGS AND LABELS

[75] Inventors: Robert E. Grabau, North Tonawanda, N.Y.; Carolyn M. Larson, Grayslake, Ill.; Michael C. Maier, East Amherst, N.Y.; Nancy G. Mitchell; Scott A. Moeller, both of Grand Island, N.Y.; Thomas P. Nash, Getzville, N.Y.; Eric V. Palmer, Amherst, N.Y.

[73] Assignee: Moore North America, Inc., Grand Island, N.Y.

[21] Appl. No.: 09/393,291

[22] Filed: Sep. 10, 1999

[51] Int. Cl.⁷ ......................................................... H01Q 1/36
[52] U.S. Cl. ...................... 343/895; 340/572; 340/825.54
[58] Field of Search ........................ 343/895; 340/572 B, 340/825.54; 156/213, 152, 298; H01Q 1/36

[56] References Cited

U.S. PATENT DOCUMENTS

| | | | |
|---|---|---|---|
| 4,706,050 | 11/1987 | Andrews | 333/205 |
| 4,783,646 | 11/1988 | Matsuzaki | 340/572 |
| 5,420,757 | 5/1995 | Eberhardt et al. | 361/813 |
| 5,444,223 | 8/1995 | Blama | 235/435 |
| 5,497,140 | 3/1996 | Tuttle | 342/51 |
| 5,528,222 | 6/1996 | Moskowitz et al. | 340/572 |
| 5,566,441 | 10/1996 | Marsh et al. | 29/600 |
| 5,574,470 | 11/1996 | deVall | 343/895 |
| 5,612,513 | 3/1997 | Tuttle et al. | 174/260 |
| 5,660,663 | 8/1997 | Chamberlain et al. | 156/152 |
| 5,682,143 | 10/1997 | Brady et al. | 340/572 |
| 5,708,419 | 1/1998 | Isaacson et al. | 340/572 |
| 5,719,586 | 2/1998 | Tuttle | 343/726 |
| 5,758,575 | 6/1998 | Isen et al. | 101/153 |
| 5,768,217 | 6/1998 | Sonoda et al. | 368/10 |
| 5,776,278 | 7/1998 | Tuttle | 156/213 |
| 5,779,839 | 7/1998 | Tuttle et al. | 156/213 |
| 5,817,207 | 10/1998 | Leighton | 156/298 |
| 5,838,253 | 11/1998 | Wurz et al. | 340/825.54 |
| 5,867,102 | 2/1999 | Souder et al. | 340/572 |
| 5,973,600 | 10/1999 | Mosher, Jr. | 340/572.8 |
| 6,024,285 | 2/2000 | Mish | 235/492 |
| 6,037,879 | 3/2000 | Tuttle | 340/825.54 |
| 6,045,652 | 4/2000 | Tuttle et al. | 156/292 |

FOREIGN PATENT DOCUMENTS 2310977 9/1997 United Kingdom ........... G08B 13/24

*Primary Examiner*—Don Wong
*Assistant Examiner*—Hoang Nguyen
*Attorney, Agent, or Firm*—Nixon & Vanderhye P.C.

[57] ABSTRACT

Radio frequency identification elements, including linerless or lined labels, are produced with enhanced effectiveness. The antenna is printed with conductive ink or toner, and cross-over may be provided by spot printing a non-conductive material over a portion of the antenna and then printing a conductive cross-over element on the non-conductive material. Typically the antenna is printed on one face of a web, and the radio frequency identification chip is moved into contact with the opposite face of the web so that the contacts penetrate the web and engage the antenna so that the web material acts as a dielectric. Alternatively part of the antenna on the first face may be over-printed with a non-conductive material and the chip attached to the first face passing through openings in, or penetrating, the non-conductive material to engage the antenna. A protective substrate or coating is provided on at least one of the chip and antenna, for example by heating heat expandable microspheres, or applying a substrate having hot melt adhesive. The antenna may be printed with a printing media comprising a carrier including resin and wax and containing conductive material in it, and by heating the carrier so that it becomes fluid and is applied as a thick film on the substrate, and by allowing the carrier to cool so as to provide a conductive antenna. The printing may be accomplished at a speed of about 500 feet per minute or more.

31 Claims, 6 Drawing Sheets

RADIO FREQUENCY IDENTIFICATION TAGS AND LABELS

BACKGROUND AND SUMMARY OF THE INVENTION

Radio frequency identification (RFID) is becoming increasingly popular and the number of applications is rapidly expanding due to decreases in chip prices. Conventional applications for RFID technology, such as shown in British published patent application 2310977 and U.S. Pat. Nos. 4,783,646, 5,566,441, 5,817,207, and 5,867,102 (the disclosures of all of which are hereby incorporated by reference herein) include cards, labels, clothing tags, and the like. For many uses, utilizing conventional techniques, the production of RFID elements is relatively cumbersome, slow, and expensive. Such drawbacks are particularly problematic when it is desired to produce relatively inexpensive RFID elements, such as labels, or other business forms, such as mailer type business forms, or relatively simple cards.

According to the present invention, methods, as well as products produced according to the methods, are provided which can result in enhanced simplicity and speed of the construction of RFID elements. For example according to one aspect of the present invention RFID elements are made from a paper web which comprises a base substrate, and by utilizing a carrier comprising a blend of thermoplastic resins and waxes which are solid at ambient temperature but become fluid at elevated temperature, and which contain conductive polymer, or metal flakes (such as copper, silver, nickel, or aluminum), or a blend thereof, therein, and the antenna may be printed at speeds in excess of about 500 feet per minute on a wide variety of substrates. Also, in the manufacture of conventional RFID elements there may be difficulties in accurately placing a chip in an area to create a necessary dielectric when the antenna is printed with conductive polymer anchor toner. Also the chips may be knocked off the substrate in subsequent handling, which could more easily occur if the element is a mailable element, such as a mailer type business form, label, or the like. Therefore according to another aspect of the invention the chip can be pushed through the substrate from the opposite side of the substrate that the antenna is printed on, and secured in place with adhesive, so that the substrate itself provides the dielectric and chip placement need not be as accurate as in conventional situations, and the chip is more likely to be held in place.

A wide variety of other advantages may be provided according to the invention, which allows the production of linerless labels, allows unique protective coatings or substrates to be applied, and generally results in the cost effective, simple, and efficient production of radio frequency identification elements of a wide variety of types, including linerless labels and other types of business forms.

According to one aspect of the present invention a method of producing an RFID element is provided comprising: (a) Unwinding a flexible substantially dielectric base substrate web from a roll, the base substrate having first and second faces. (b) Printing a radio frequency identification antenna with conductive ink or toner on the substrate first face. (c) Spot printing a non-conductive material over a portion of the antenna for cross-over. (d) Printing a conductive cross-over element on the non-conductive material to complete the radio frequency identification antenna. (e) Bringing a radio frequency identification chip into operative contact with the radio frequency identification antenna. And, (f) providing at least one protective substrate or coating on at least one of the radio frequency identification chip and antenna.

The radio frequency identification chip has contacts (which may be tapered to a point or edge), and (e) may be practiced by pushing the radio frequency identification chip into operative contact with the base substrate second face, and by pressing the chip contacts through the base substrate from the second face thereof, into contact with the radio frequency identification antenna, and securing the radio frequency identification chip in place. Also (e) may be further practiced by securing the radio frequency identification chip in place with adhesive acting between the chip and the base substrate second face.

Alternatively, (e) may be practiced by overprinting part of the antenna on the first face of the base substrate with a non-conductive material, and by pushing the contacts into contact with the antenna. For example (e) may be further practiced by spot coating the non-conductive material so that openings therein for receipt of the contacts of the chip are provided, and by pushing the chip contacts through those openings.

According to one aspect of the invention (f) may be practiced by applying a coating of heat expandable microspheres to at least one of the chip and antenna, and heating the spheres to expand them and provide a flexible protective coating. Alternatively (f) may be practiced (typically when using a paper web as the base substrate) by applying a protective substrate with adhesive over at least one of the chip and antenna so as to adhesively secure the protective substrate to at least one face of the base substrate. The method may further comprise (g) applying a pressure sensitive adhesive to the at least one protective substrate or coating, so that the element function as a label. For example (f) may be practiced by applying a protective substrate or coating to both faces of the base substrate; and (g) may be practiced to provide pressure sensitive adhesive to one of the protective substrates or coating, and a pressure sensitive adhesive release coating to the other of the protective substrates or coatings, so as to provide linerless labels. For example (a) through (g) may be practiced to produce a flexible web of RFID labels, and the method may further comprise taking up the web in roll form.

According to another aspect of the present invention a method of producing an RFID element using a substantially dielectric base substrate (such as paper) having first and second opposite faces and a RFID chip having contacts, is provided. The method comprises: (a) Printing a radio frequency identification antenna with conductive ink or toner on the substrate first face. (b) Bringing the radio frequency identification chip into operative contact with the radio frequency identification antenna by pushing the radio frequency identification chip into operative contact with the base substrate second face, and by pressing the chip contacts through the base substrate from the second face thereof, into contact with the radio frequency identification antenna, and securing the radio frequency identification chip in place. And, (c) providing at least one protective substrate or coating on at least one of the radio frequency identification chip and antenna. The details of the practice of (c), and the production of labels, the application particular protective substrates or coatings, or the like may be as described above.

The invention also relates to RFID elements produced from the methods as described above, and also relates to an RFID element which comprises: A substantially dielectric base substrate having first and second opposite faces. A radio frequency identification antenna of conductive material disposed on the first face of the base substrate. A radio frequency identification chip having contacts, the chip in operative association with the base substrate second face and the chip contacts penetrating the base substrate so that the contacts are in electrical contact with the antenna, and the base substrate substantially serves as a dielectric. And, at least one protective coating or substrate provided on at least one of the antenna and chip.

The element may further comprise a first protective coating or substrate covering the antenna and a second protective coating or substrate covering the chip. For example the element may further comprise a pressure sensitive adhesive provided on one of the first and second protective coatings or substrates, and a pressure sensitive adhesive release coat provided on the other of the first and second protective coatings or substrates, so that the element comprises a linerless label.

Alternatively the element may further comprise a pressure sensitive adhesive produced on the at least one protective coating or substrate, and a release liner provided over the pressure sensitive adhesive, so that the element comprises a linered label.

The antenna may comprise a Bistatil® antenna available from Motorola an antenna with cross-over. Preferably the element is flexible and is part of a roll of like, interconnected, flexible elements, and the base substrate is preferably paper, although other substrates may be utilized.

According to yet another aspect of the present invention there is provided a method of producing a radio frequency identification element from using a substantially dielectric base substrate having first and second opposite faces and a radio frequency identification chip having contacts, comprising: (a) Printing a radio frequency identification antenna with conductive ink or toner on the substrate first face. (b) Bringing the radio frequency identification chip contacts into operative contact with the radio frequency identification antenna. And, (c) providing at least one protective substrate or coating on at least one of the radio frequency identification chip and antenna by applying a coating of heat expandable microspheres to at least one of the chip and antenna, and heating the microspheres to expand them and flexible protective a flexible protective coating.

According to yet another aspect of the present invention there is provided a method of producing an RFID element comprising: (a) Printing a radio frequency identification antenna on the substrate first face using a printing media comprising a carrier including resin and wax which becomes fluid upon heating, and containing conductive materials therein, by heating the carrier so that it becomes fluid and is applied as a thick film on the substrate first face, and by allowing the carrier to cool so as to provide a conductive antenna. (b) After cooling of the carrier, bringing the radio frequency identification chip contacts into operative contact with the radio frequency identification antenna. And, (c) providing at least one protective substrate or coating on at least one of the radio frequency identification chip and antenna. The details of the printing of particular antennas (such as bistatik or cross-over antennas), or the production of labels, or other business forms or the like, may be as described above. Also in the practice of the invention (a) may be practiced (such as using paper as the base substrate) at a speed of about 500 feet per minute or more.

It is the primary object of the present invention to provide for the versatile, simple, yet effective production of RFID elements. This and other objects of the invention will become clear from an inspection of the detailed description of the invention and from the appended claims.

DETAILED DESCRIPTION OF THE DRAWINGS

Figure 1:
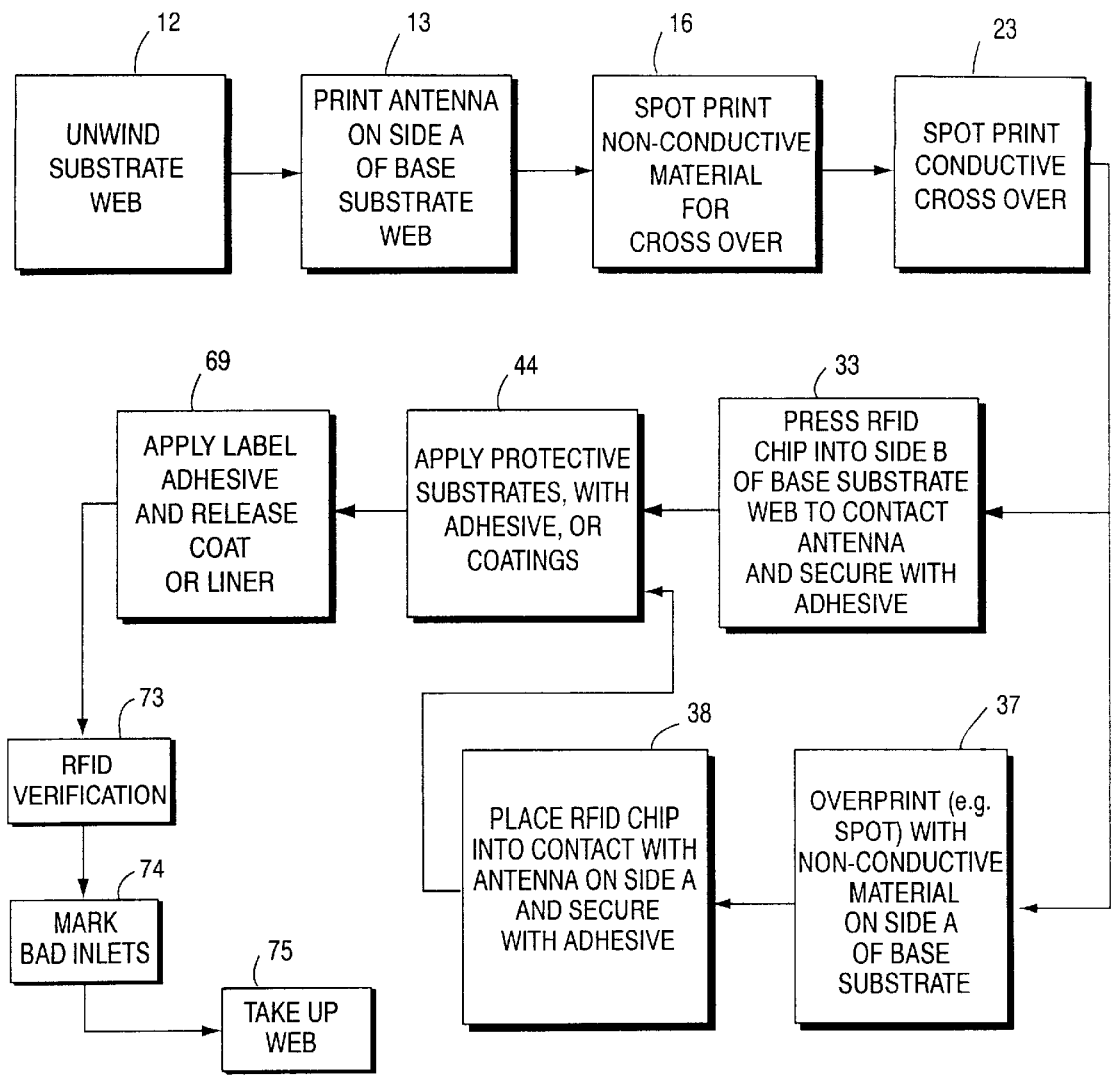
FIG. 1 is a box diagram showing an exemplary method for producing RFID elements according to the present invention.
Figure 2:
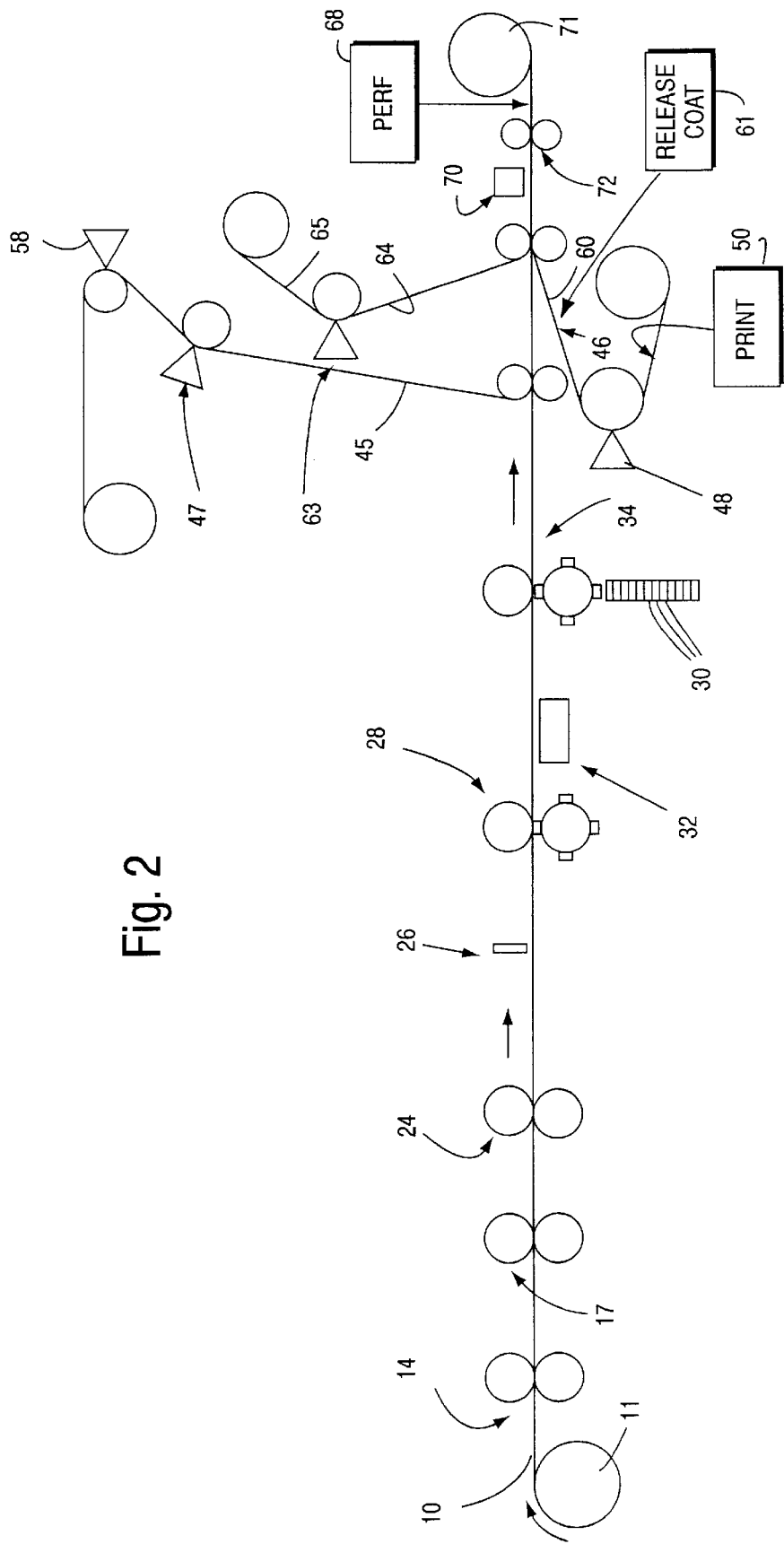
FIG. 2 is a side schematic view of exemplary apparatus that may be used in the practice of the method as shown schematically in FIG. 1.

FIGS. 1 and 2 schematically illustrate the practice of various aspects of a method according to the present invention for producing an RFID element, such as any one of the elements illustrated in FIGS. 3 through 11. For the embodiment illustrated in the drawings a flexible substantially dielectric base substrate web 10 (see FIG. 2) is unwound from a roll 11, as illustrated schematically by box 12 in FIG. 1. The web 10 preferably is paper of any desired conventional type and weight for producing the particular RFID element that will be produced, although a wide variety of other substrates may be utilized including a wide variety of different plastic substrates or—if flexible enough—cardboard, or the like. While the method steps, and the apparatus for the practice thereof, are illustrated in a particular sequence in FIGS. 1 and 2, it is to be understood that a number of the steps may be practiced in different order without adversely affecting the desired results according to the invention.

Figure 3:
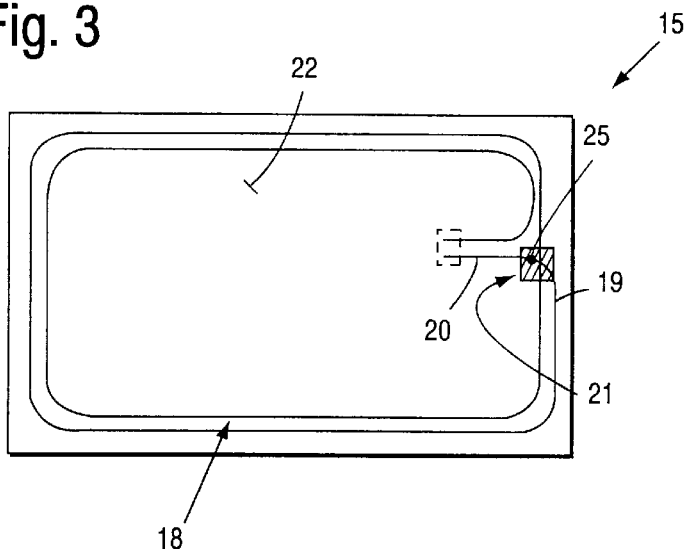
FIG. 3 is a top plan view of one form of an exemplary RFID element according to the present invention.

Box 13 illustrated in FIG. 1 indicates the method procedure of printing the antenna on one face or side (in this case the top face of the web 10 illustrated in FIG. 2) of the base substrate web 10, for example utilizing conventional printing cylinders 14 (FIG. 2). The RFID antenna may be printed with any suitable conductive ink or toner, such as the water based conductive carbon ink, such as that sold by DuPont Electronic Materials with the trade designation E95817-152, or a water based silver ink sold by Acheson Colloids Company of Port Huron, Mich. with the product designation PE-001. Alternatively the material for printing the antenna utilized in box 13, and with apparatus 14, may be an ink that includes resin and wax (typically a plurality of each), such as disclosed in U.S. Pat. No. 5,830,942 and printed International Publication WO 94/14902, with conductive materials therein such as silver, copper, aluminum, nickel, or like metal flakes, carbon, conductive polymers, or a blend thereof. The thermoplastic resin and wax carrier is solid at ambient temperature, but becomes fluid at the operating temperature of the printer 14 (which may be a conventional pattern coater), and a relatively thick film (e.g. on the order of 3–15 microns) may be readily printed on the substrate 10 even with an operating speed of about 500 feet per minute or greater (that is the speed of the web 10), e.g. 500–1500 fpm.

Where a cross-over antenna is to be provided, such as illustrated for the RFID element 15 of FIG. 3, a non-conductive material is spot printed over a portion of the antenna for cross-over. This is illustrated schematically by box 16 in FIG. 1, and by the conventional printing equipment 17 in FIG. 2. With reference to the particular element 15 that is exemplified in FIG. 3, the conductive material antenna 18 was printed at 13 but without a connection between the portions 19 and 20 thereof, and in box 16 the non-conductive material is printed on the face 22, over the antenna 18 at the area of the portions 19, 20 thereof. The face 22 is the first, top, face of the web 10 as seen in FIG. 2.

The non-conductive material 21 for the cross-over may be any suitable non-conductive material that can be applied by conventional printing/coating techniques. For example it may be a barium titanate, such as sold by Tam with the product designation Tamtron X7R302H, or it may be an acrylated oligomer, such as sold by Ferco under the product designation UV2001.

After the non-conductive material 21 is spot printed, as illustrated by box 23 in FIG. 1 and by apparatus 24 in FIG. 2, a conductive cross-over element is printed on the non-conductive material 21. The cross-over element is indicated by reference numeral 25 in the exemplary embodiment of FIG. 3.

The apparatus of FIG. 2 may include conventional scanning equipment 26 to scan the web 10 to ensure alignment and registery of the components for future processing, and for that purpose any suitable conventional sense lines, marks, or the like may be applied to the web 10, or the scanner 26 may be of the type that will sense the portions of the antenna 18 which have been applied.

Figure 4:
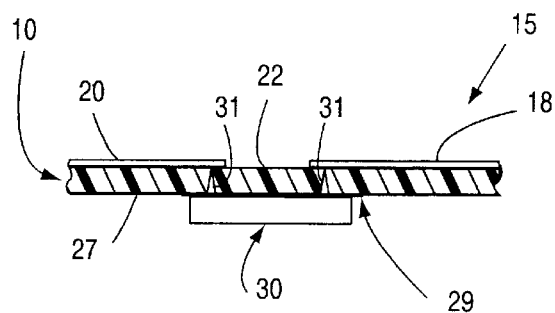
FIG. 4 is a side detail view, partly in cross-section and partly in elevation, of the element of FIG. 3 showing the interconnection between the chip and antenna.

For the embodiment of the RFID element 15 illustrated in FIGS. 3 and 4, spot adhesive (such as hot melt pressure sensitive adhesive, or heat cured adhesive) may be applied to the second face 27 (see FIG. 4) of the web 10, opposite the first face 22, utilizing equipment schematically illustrated at 28 in FIG. 2. Exemplary hot melt adhesives that may be provided are for example sold under the trademarks "Duro-Tak 4144" or "Duro-Tak 8686". Where low peel pressure sensitive adhesives are utilized, Nacor® 4536 water borne acrylic pressure sensitive adhesives may be utilized. The Duro-Tak and Nacor® products are sold by National Starch and Chemical Company. The adhesive 29 (see FIG. 4) so applied is adapted to receive a conventional RFID chip 30, having contacts 31 thereof. The contacts 31 may be of any suitable construction, and may be tapered to a point or to substantially a knife edge to facilitate penetration of the base substrate/web 10 as will be hereinafter described.

If the adhesive 29 that is applied is heat curable, then a dryer or like apparatus 32 is provided after the spot adhesive applicator 28.

In the production of the element 15 of FIGS. 3 and 4, as illustrated schematically by box 33 in FIG. 1, and as illustrated schematically by apparatus 34 in FIG. 2, the RFID chip 30 is brought into operative contact with the antenna 18 by pushing the chip 30 into operative contact with the base substrate 10 second face 27, and by pressing the chip contacts 31 through the base substrate 10 from the second face 27 thereof, into contact with the antenna 18 (including perhaps portion 20 thereof). The chip 30 is secured in place by the adhesive 29, and/or by mechanical locking with the substrate 27, or by applying a subsequent substrate or coating (which also may provide a protective function), or by a combination of these. The RFID element 15 so produced—as illustrated in FIGS. 3 and 4—eliminates the need to create a gap for a dielectric, as the dielectric substrate 10 (typically paper or dielectric plastic) serves this function. Also chip placement need not be particularly accurate, just so the contacts 31 ultimately contact the antenna 18.

Figure 5:
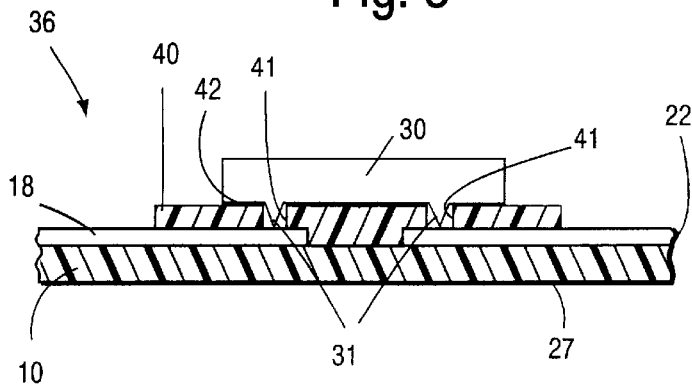
FIG. 5 is a view like that of FIG. 4 only showing another embodiment according to the present invention.

An alternative procedure, for production of the RFID element 36 of FIG. 5, is illustrated by boxes 37 and 38 in FIG. 1. In this embodiment a non-conductive material 40—like the material 21, for example—and which may or may not have the openings 41 therein is applied over the top face 22 of the substrate 10 over at least part of the antenna 18 and taking up an area significantly greater than the area of the chip 30 and contacts 31 thereof. The chip 30 is then moved into operative contact with the antenna 18 by passing the contacts 31 through the openings 41, or by penetrating the material 40 with the contacts 31 if "sharp". The chip 30 may be held to the material 40 by a conventional pressure sensitive or other adhesive 42, similar to the adhesive 29.

After boxes 33 or 38, illustrated in FIG. 1, the method further comprises—as illustrated schematically at box 44—applying protective substrates or coatings to one or both of the chip 30 and antenna 18. A protective substrate may be any conventional protective material, such as another sheet of paper, a foamed element, a plastic sheet having abrasion and/or cushioning properties, or the like. Where a substrate is provided preferably it is held in contact with the RFID element that exists at that stage with adhesive.

FIG. 2 illustrates various equipment for providing protective substrates 45, 46 to both the faces 22, 27 of the base substrate 10 utilizing hot melt pressure sensitive adhesive which is applied as schematically illustrated at 47 and 48 in FIG. 2. The substrate 45 may be printed or otherwise imaged with indicia, as illustrated schematically at 50 in FIG. 2, e.g. to produce the indicia 51 illustrated in FIGS. 10 and 11, which will be described hereafter.

Figure 7:
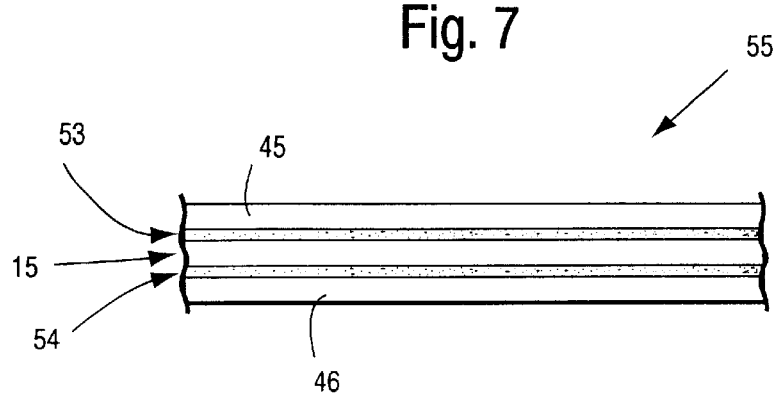
FIGS. 7 through 9 are side schematic enlarged views of various forms of completed RFID elements according to the present invention, FIG. 8 showing the RFID element in the form of a linerless label and FIG. 9 showing the RFID element in the form of a linered label.

FIG. 7 schematically illustrates the RFID element 15 which has the protective substrates 45, 46 in operative association therewith, held in place by the adhesive layers 53, 54 applied at the stations 47, 48 of FIG. 2, respectively. The final RFID element 55 (see FIG. 7) so produced may be a card, tag, or like structure. Alternatively, either a linerless or a lined label may be made from the structure 55.

Figure 8:
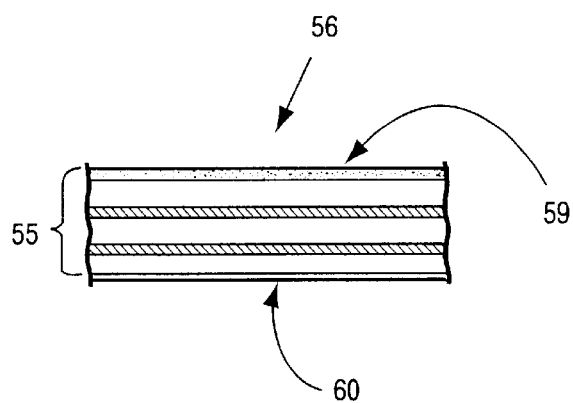
Figure 10:
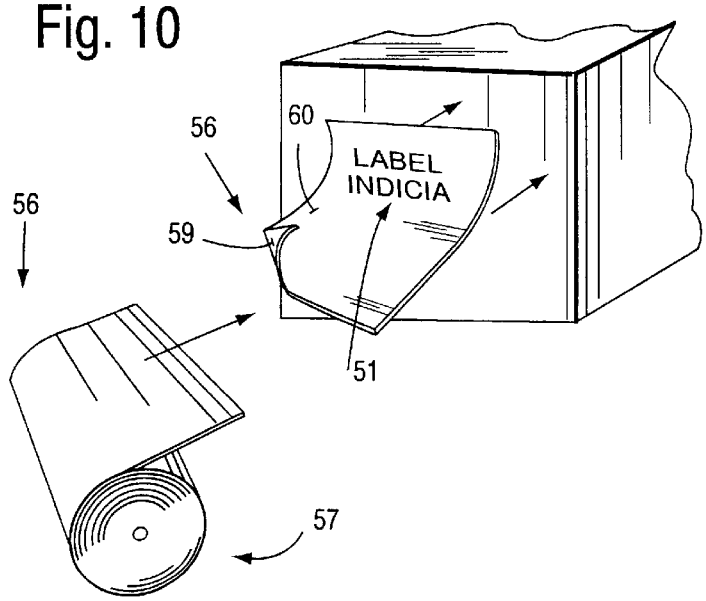
FIG. 10 is a schematic perspective illustration of the application of a linerless label from a roll of labels like that of FIG. 8 to a package or other structure designed to have RFID technology associated therewith.

FIG. 8 illustrates schematically a linerless label 56 produced from the basic RFID element 55 of FIG. 7, the linerless label 56 also illustrated in FIG. 10 and shown as taken from a roll 57 therein. The apparatus of FIG. 2 for providing the linerless label includes a pressure sensitive adhesive applicator 58 which applies the adhesive 59 seen in FIGS. 8 and 10. For example a hot melt pressure sensitive adhesive 59 may be applied. If the linerless label 56 is to be produced then the substrate 46 either inherently has the pressure sensitive adhesive release coat 60 (see FIGS. 2, 8, and 10) thereon, or the release coat 60 is applied as illustrated schematically by the apparatus 61 in FIG. 2. The roll of linerless labels 57 so produced may have perforations, die cuts, or like lines of weakness separating each element 56 from another.

Figure 9:
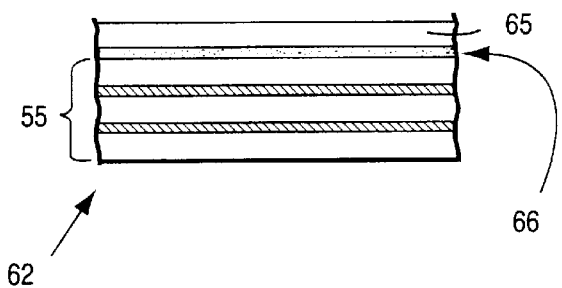
Figure 11:
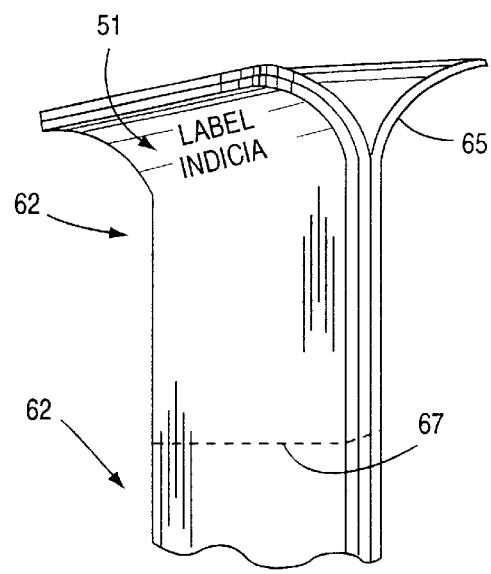
FIG. 11 is a top perspective view showing a linered label such as illustrated in FIG. 3 with the release liner being separated therefrom, and interconnected to like elements.

If a linered label RFID element—such as illustrated schematically at 62 in FIGS. 9 and 11—is desired then instead of the applicator 58 an applicator 63 is provided for applying the hot melt pressure sensitive adhesive to the face 64 of a conventional silicone release liner 65. FIG. 8 shows the adhesive 66 applied by the station 63, and the release liner 65 in contact with the adhesive 66, while FIG. 11 shows the release liner 65 being pulled away from the rest of the RFID element 62. For this embodiment two individual elements 62 may be separated from each other by a line of weakness 67, such as introduced by the perf or die cut equipment schematically illustrated at 68 in FIG. 2.

The various label construction procedures that may be utilized are illustrated schematically by box 69 in FIG. 1.

In addition to the equipment heretofore described preferably verification apparatus 70 is provided just before the take-up roll 71, and marking equipment 72 for bad units may be provided just downstream of the verification unit 70. These procedures are illustrated schematically at 73 and 74 in FIG. 1, while the take-up is illustrated schematically 75 therein. All of the equipment utilized in FIG. 2 is conventional equipment, no special equipment being necessary to practice the invention.

Figure 12:
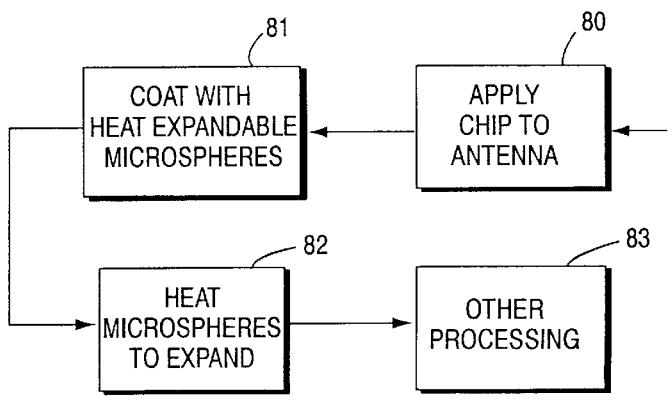
FIG. 12 is a box diagram showing a modification of the method of FIG. 1 at a particular area thereof.

Instead of applying a substrate, such as the substrates 45, 46, to protect one or both faces of the element 15, or the element 36, a protective coating may be applied. One exemplary manner and construction for doing this is illustrated schematically in FIG. 12 wherein alter the box 80 where the chip 30 was applied to the antenna 18 (either in the manners illustrated in FIGS. 3 through 5, or in some other way) one or both faces 22, 27 of the substrate, including the elements 30 and/or 18 associated therewith, are coated with heat expandable microspheres, as illustrated schematically at 81, utilizing conventional technology, and conventional microspheres. The microspheres may be applied over the entire substrate face 22, 27, or just two selected areas thereof. Then—as illustrated schematically at 82 in FIG. 1—an appropriate conventional source applies heat that causes the microspheres to expand. The protective covering that results is cushioning, and flexible, and is not significantly damaged during subsequent processing, as illustrated at 83 in FIG. 12. The procedures 81, 82 may be applied at a wide variety of different points during processing, as long as either one or both of the elements 30, 18 to be protected have been applied.

Figure 6:
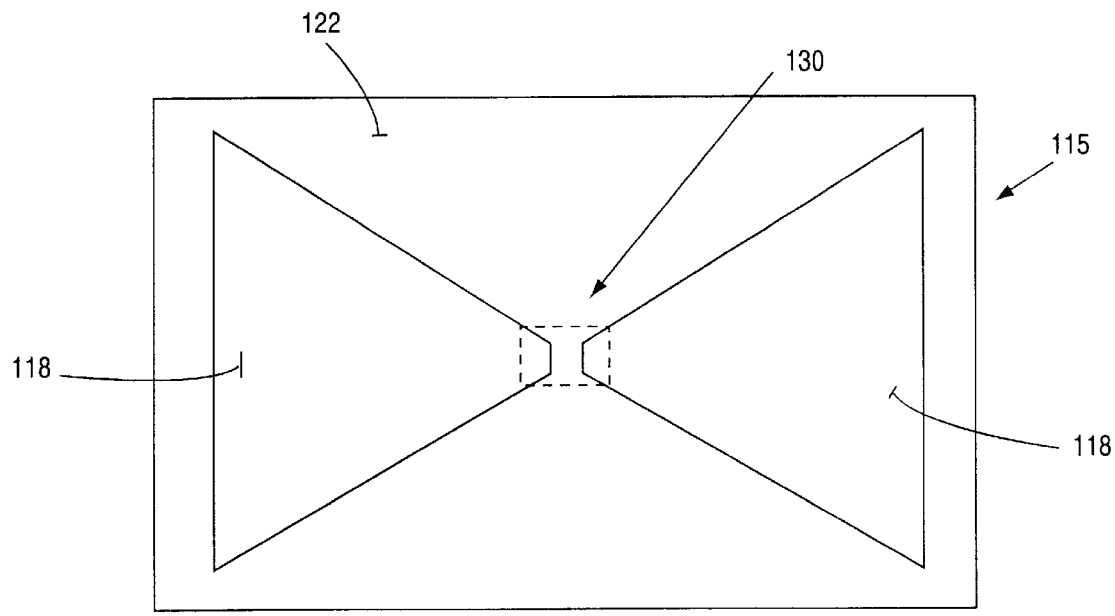
FIG. 6 is a view like that of FIG. 3 only showing another embodiment of an RFID element according to the present invention.

FIG. 6 illustrates a different form of RFID element that may be produced according to the invention, having a different type of antenna. In the FIG. 6 embodiment components comparable to those in the FIGS. 3 and 4 embodiments are shown by, the same reference numeral only preceded by a "1". In this case the antenna 118 is a bistatik antenna which is printed utilizing any of the conventional or suitable materials described above with respect to the antenna 18, and the chip—shown in dotted line because it is on the opposite side of the element 115 from the antenna 118—130 has the contacts thereof pressed into operative association with the antenna elements 118.

The chip 130 may be held in place on the face opposite the face 122 (like the face 27) with an adhesive comparable to the adhesive 29 in the FIG. 4 embodiment.

Any suitable adhesive may be utilized as the adhesive 59, 66 for the label versions of the invention, including repositional and removable adhesives. Also different RFID elements aside from the cards and labels described may be produced, including other types of business forms such as mailer type business forms, tags for merchandise, or the like.

All specific narrower ranges within any broad range given above is also specifically provided herein.

It will thus be seen that according to the present invention an advantageous method of producing RFID elements, and advantageous RFID elements so produced, are provided. While the invention has been herein shown and described in what is presently conceived to be the most practical and preferred embodiment thereof it will be apparent to those of ordinary skill in the art that many modifications may be made thereof within the scope of the invention, which scope is to be accorded the broadest interpretation of the appended claims so as to encompass all equivalent methods and products.

What is claimed is:

1. A method of producing a radio frequency identification element comprising:
   (a) unwinding a flexible substantially dielectric base substrate web from a roll, the base substrate having first and second faces;
   (b) printing a radio frequency identification antenna with conductive ink or toner on the substrate first face;
   (c) spot printing a non-conductive material over a portion of the antenna for cross-over;
   (d) printing a conductive cross-over element on the non-conductive material to complete the radio frequency identification antenna;
   (e) bringing a radio frequency identification chip into operative contact with the radio frequency identification antenna; and
   (f) providing at least one protective substrate or coating on at least one of the radio frequency identification chip and antenna.

2. A method as recited in claim 1 wherein the radio frequency identification chip has contacts; and wherein (e) is practiced by pushing the radio frequency identification chip into operative contact with the base substrate second face, and by pressing the chip contacts through the base substrate from the second face thereof, into contact with the radio frequency identification antenna, and securing the radio frequency identification chip in place.

3. A method as recited in claim 2 wherein (e) is further practiced by securing the radio frequency identification chip in place with adhesive acting between the chip and the base substrate second face.

4. A method as recited in claim 1 wherein the radio frequency identification chip has contacts; and wherein (e) is practiced by overprinting part of the antenna on the first face of the base substrate with a non-conductive material, and by pushing the contacts into contact with the antenna.

5. A method as recited in claim 4 wherein (e) is further practiced by spot coating the non-conductive material so that openings therein for receipt of the contacts of the chip are provided, and by pushing the chip contacts through those openings.

6. A method as recited in claim 1 wherein (f) is practiced by applying a coating of heat expandable microspheres to at least one of the chip and antenna, and heating the spheres to expand them and provide a flexible protective coating.

7. A method as recited in claim 1 wherein (a)–(f) are practiced using a paper web as the base substrate; and wherein (f) is practiced by applying a protective substrate with adhesive over at least one of the chip and antenna so as to adhesively secure the protective substrate to at least one face of the base substrate.

8. A method as recited in claim 7 further comprising (g) applying a pressure sensitive adhesive to the at least one protective substrate or coating, so that the element functions as a label.

9. A method as recited in claim 8 wherein (f) is practiced by applying a protective substrate or coating to both faces of the base substrate; and wherein (g) is practiced to provide pressure sensitive adhesive to one of the protective substrates or coating, and a pressure sensitive adhesive release coating to the other of the protective substrates or coatings, so as to provide linerless labels.

10. A method as recited in claim 8 wherein (a)–(g) are practiced to produce a flexible web of radio frequency identification labels, and further comprising taking up the web in roll form.

11. A method of producing a radio frequency identification element using a substantially dielectric base substrate having first and second opposite faces and a radio frequency identification chip having contacts, comprising:

(a) printing a radio frequency identification antenna with conductive ink or toner on the substrate first face;

(b) bringing the radio frequency identification chip into operative contact with the radio frequency identification antenna by pushing the radio frequency identification chip into operative contact with the base substrate second face, and by pressing the chip contacts through the base substrate from the second face thereof, into contact with the radio frequency identification antenna, and securing the radio frequency identification chip in place; and (c) providing at least one protective substrate or coating on at least one of the radio frequency identification chip and antenna.

12. A method as recited in claim 11 wherein (c) is further practiced by securing the radio frequency identification chip in place with adhesive acting between the chip and the base substrate second face.

13. A method as recited in claim 11 wherein (c)–(f) are practiced using a paper web as the base substrate; and wherein (c) is practiced by applying a protective substrate with adhesive over at least one of the chip and antenna so as to adhesively secure the protective substrate to at least one face of the base substrate.

14. A method as recited in claim 13 further comprising (d) applying a pressure sensitive adhesive to the at least one protective substrate or coating, so that the element functions as a label.

15. A method as recited in claim 14 wherein (c) is practiced by applying a protective substrate or coating to both faces of the base substrate; and wherein (d) is practiced to provide pressure sensitive adhesive to one of the protective substrates or coating, and a pressure sensitive adhesive release coating to the other of the protective substrates or coatings, so as to provide linerless labels.

16. A method as recited in claim 11 wherein (c) is practiced by applying a coating of heat expandable microspheres to at least one of the chip and antenna, and heating the microspheres to expand them and provide a flexible protective coating.

17. A radio frequency identification element comprising:

a substantially dielectric base substrate having first and second opposite faces;

a radio frequency identification antenna of conductive material disposed on said first face of said base substrate;

a radio frequency identification chip having contacts, said chip in operative association with said base substrate second face and said chip contacts penetrating said base substrate so that said contacts are in electrical contact with said antenna, and said base substrate substantially serves as a dielectric; and at least one protective coating or substrate provided on at least one of said antenna and chip.

18. An element as recited in claim 17 further comprising a first protective coating or substrate covering said antenna and a second protective coating or substrate covering said chip.

19. An element as recited in claim 18 further comprising a pressure sensitive adhesive provided on one of said first and second protective coatings or substrates, and a pressure sensitive adhesive release coat provided on the other of said first and second protective coatings or substrates, so that said element comprises a linerless label.

20. An element as recited in claim 17 further comprising a pressure sensitive adhesive produced on said at least one protective coating or substrate, and a release liner provided over said pressure sensitive adhesive, so that said element comprises a linered label.

21. An element as recited in claim 17 wherein said antenna comprises a bistatik antenna.

22. An element as recited in claim 17 wherein said element is flexible and is part of a roll of like, interconnected, flexible elements, and wherein said base substrate is paper.

23. A method of producing a radio frequency identification element from using a substantially dielectric base substrate having first and second opposite faces and a radio frequency identification chip having contacts, comprising:

(a) printing a radio frequency identification antenna with conductive ink or toner on the substrate first face;

(b) bringing the radio frequency identification chip contacts into operative contact with the radio frequency identification antenna; and (c) providing at least one protective substrate or coating on at least one of the radio frequency identification chip and antenna by applying a coating of heat expandable microspheres to at least one of the chip and antenna, and heating the microspheres to expand them and flexible protective a flexible protective coating.

24. A method as recited in claim 23 wherein (a)–(c) are practiced using a paper web as the base substrate; and further comprising (d) applying a pressure sensitive adhesive to the at least one of the base substrate or protective coating, so that the element functions as a label.

25. A method of producing a radio frequency identification element from using a substantially dielectric base substrate having first and second opposite faces and a radio frequency identification chip having contacts, comprising:

(a) printing a radio frequency identification antenna on the substrate first face using a printing media comprising a carrier including resin and wax which becomes fluid upon heating, and containing conductive materials therein, by heating the carrier so that it becomes fluid and is applied as a thick film on the substrate first face, and by allowing the carrier to cool so as to provide a conductive antenna;

(b) after cooling of the carrier, bringing the radio frequency identification chip contacts into operative contact with the radio frequency identification antenna; and (c) providing at least one protective substrate or coating on at least one of the radio frequency identification chip and antenna.

26. A method as recited in claim 25 wherein (a) is further practiced to print a bistatik antenna.

27. A method as recited in claim 25 wherein (a) is further practiced to spot print a non-conductive material over a portion of the antenna for cross-over, and to print a conductive cross-over element on the non-conductive material to complete the radio frequency identification antenna.

28. A method as recited in claim 25 wherein (c) is further practiced by securing the radio frequency identification chip in place with adhesive acting between the chip and the base substrate second face.

29. A method as recited in claim 25 further comprising (d) applying a pressure sensitive adhesive to the at least one protective substrate or coating, so that the element functions as a label.

30. A method as recited in claim 29 wherein (c) is practiced by applying a protective substrate or coating to both faces of the base substrate; and wherein (d) is practiced to provide pressure sensitive adhesive to one of the protective substrates or coating, and a pressure sensitive adhesive release coating to the other of the protective substrates or coatings, so as to provide linerless labels.

31. A method as recited in claim 25 wherein (a) is practiced using paper as the base substrate, and at a speed of about 500 feet per minute or more.

* * * * *